United States Patent [19]

Te Velde

[11] Patent Number: 4,561,173
[45] Date of Patent: Dec. 31, 1985

[54] METHOD OF MANUFACTURING A WIRING SYSTEM

[75] Inventor: Ties S. Te Velde, Eindhoven, Netherlands

[73] Assignee: U.S. Philips Corporation, New York, N.Y.

[21] Appl. No.: 500,791

[22] Filed: Jun. 7, 1983

Related U.S. Application Data

[63] Continuation of Ser. No. 084,038, Oct. 12, 1979, abandoned.

[30] Foreign Application Priority Data

Nov. 14, 1978 [NL] Netherlands ............... 7811227

[51] Int. Cl.$^4$ ........................................... H01L 21/90
[52] U.S. Cl. .................................. 29/577 C; 29/591; 156/644; 156/652; 156/656
[58] Field of Search ............. 156/644, 650, 651, 652, 156/656; 29/577 C, 591

[56] References Cited

U.S. PATENT DOCUMENTS

| | | | |
|---|---|---|---|
| 3,461,524 | 8/1969 | Lepselter | 357/68 |
| 3,647,585 | 3/1972 | Fritzinger et al. | 156/656 |
| 3,769,108 | 10/1973 | Feldman et al. | 357/68 |
| 3,783,056 | 1/1974 | Keller et al. | 156/650 |
| 3,801,388 | 4/1974 | Akiyama et al. | 156/656 |
| 3,890,177 | 6/1975 | Pfahnl et al. | 156/656 |
| 3,993,515 | 11/1976 | Reichert | 357/71 |
| 4,308,090 | 12/1981 | Te Velde et al. | 357/71 |
| 4,309,242 | 1/1982 | Te Velde et al. | 156/656 |

FOREIGN PATENT DOCUMENTS 7510103 3/1977 Netherlands.

Primary Examiner—Brian E. Hearn
Assistant Examiner—Alan E. Schiavelli
Attorney, Agent, or Firm—Robert T. Mayer; Steven R. Biren

[57] ABSTRACT

A self-registering method of manufacturing an air-(vacuum) -insulated crossing multilayer wiring system of large density is disclosed. Between the lowermost and uppermost wiring layers an intermediate layer is provided in which recesses are formed between the intermediate layer and the lowermost wiring layer. By means of said recesses the intermediate layer can be removed entirely at the area of the crossings during the etching process, while elsewhere portions of the intermediate layer remain as supporting parts or as connecting members.

2 Claims, 17 Drawing Figures

15A

15B

METHOD OF MANUFACTURING A WIRING SYSTEM

This is a continuation of application Ser. No. 084,038, filed Oct. 12, 1979, now abandoned.

BACKGROUND OF THE INVENTION

The invention relates to a method of manufacturing a wiring system on a supporting body which is provided at least at one surface with a first pattern of electrically conductive material and with a second pattern of electrically conductive material having at least one track crossing the first pattern, in which after providing the first pattern, a layer, termed intermediate layer, of a material which can be etched selectively with respect to the materials of the first and the second pattern is provided over substantially the whole surface, which layer is subjected to a selective etching treatment in which the tracks of the second pattern form an etching mask, in which at the area of the crossing the intermediate layer is removed over an essential part of it thickness and supporting parts are formed from the intermediate layer beyond the said crossing below the second pattern, which parts extend over the whole distance between the second conductor track and the surface of the supporting body or between the second and the first pattern of conductor tracks.

The invention relates in addition to a wiring system manufactured according to such a method, as well as to a semiconductor device having such a wiring system.

Multilayer wiring systems having insulated crossings are known and are generally used in integrated circuits. They increase the freedom of design, in particular when very many circuit elements (transistors, resistors) are integrated in one semiconductor body.

A crossing as described above is generally insulated by air (if desired, vacuum or a filling gas, for example nitrogen). Since the dielectric constant of air (vacuum) is considerably smaller than that of silicon oxide, the parasitic capacitances of such crossings are generally very small compared with those of the usual crossings in which the conductor patterns are insulated by silicon oxide. In addition, short-circuits via so-called pinholes are avoided.

A method as described above is disclosed in applicant's Netherlands Patent Application No. 7608901, which corresponds to U.S. Pat. No. 4,308,090.

In this method an air-insulated crossing is obtained by entirely etching away the intermediate layer below the crossing part of the uppermost conductive pattern. This means that the etching treatment has to be continued until it is sure that the intermediate layer below said crossing part has been removed by lateral etching.

As is also described in said Patent Application, remaining parts of the intermediate layer serve as supporting parts for the second conductive layer. At the location of such a supporting part, the intermediate layer may therefore not be removed entirely during the said etching step. In order to prevent this, the tracks of the second conductive pattern at the area of the supporting part are therefore chosen to be wider than at the area of the crossing so that the intermediate layer below widened parts beyond the crossing is maintained at least partly and locally supports the second pattern of conductive material.

However, this measure causes loss of space in that locally more space is necessary for the conductor tracks. Moreover, for the mutual alignment of the masks defining said widened parts at the area of the crossings, alignment tolerances must be observed.

SUMMARY OF THE INVENTION

One of the objects of the invention is to provide a method with which greater packing density can be achieved. Another object of the invention is to increase the rate of etching of the intermediate layer at the area of the crossings and hence to accelerate and simplify the process.

The invention is based on the recognition of the fact that this can be achieved by causing the etching to take place more effectively and more rapidly at the area of the crossing than elsewhere by causing the intermediate layer at the area of the crossing to be attacked by the etching process from several and/or other sides.

A method according to the invention is characterized in that recesses are provided between the first pattern and the intermediate layer, which recesses extend at least to below the crossing so that at the area of the crossing the intermediate layer is etched away also on the lower side via the recesses while at the area of the supporting parts the material of the intermediate layer is attacked only laterally, the etching treatment being continued at least until the first pattern is entirely exposed at the area of the crossing.

Since at the area of the crossing the etchant attacks from several sides, the intermediate layer will disappear selectively rapidly. This means that the intermediate layer below the crossing can be removed over a substantial part of its thickness so rapidly that beyond the crossing only a small part of the intermediate layer below the edges of the conductive tracks has been etched away by underetching, while centrally below said tracks the intermediate layer is still present as a supporting part.

In principle the exposure of the lowermost conductor track will suffice in which at the area of the crossing material of the intermediate layer remains present on the lower side of the second pattern of conductive material. Although this is sufficient for good insulation, the intermediate layer at the area of the crossing is preferably etched away throughout its thickness. As a result of this, both the capacitive coupling and the possibility of a short-circuit are reduced at the area of the crossing.

The conductor tracks of the second pattern are preferably continuous tracks having a substantially uniform width. This makes it possible to give said tracks a minimum track width independently of alignment tolerances, which, notably when used as wiring systems of integrated circuits, results in high packing densities.

A preferred embodiment of a method according to the invention is characterized in that the material of the second pattern of conductive material is provided by means of electrodeposition.

This has for its result that the material of the second pattern grows only in one direction. In fact, dependent on the method and material used, pin holes may be present in the intermediate layer. If the material of the second pattern should be deposited on the intermediate layer, for eample, by known methods, such as vapor deposition or sputtering, the possibility exists that said pinholes will be filled with said material. Because this material can withstand etching during the removal of the intermediate layer, a shortcircuit may be formed between the first and the second conductor pattern. Since during the electrodeposition the material of the second conductor pattern grows only in one direction, the filling of the pinholes and hence the occurrence of short circuits is avoided.

A first important embodiment of a method according to the invention is characterized in that the first pattern of conductive material is provided in the form of tracks the upper area of which is larger than the lower area, so that a shadow effect occurs at the edges of said tracks as a result of which upon depositing the intermediate layer no material of the intermediate layer is deposited below said edges and the recesses are obtained.

The etchant has free access along the lowermost conductor track and may remove the parts of the intermediate layer situated above the lowermost conductor tracks from the recesses. Simultaneously, the intermediate layer is etched from above from the edges of the material of the second pattern of conductive material. In this case the tracks of the second pattern of conductive material are wider than those of the first pattern of conductive material. Hence, when at the area of the crossing the intermediate layer above the lowermost conductor is etched away entirely, the intermediate layer in other places below the second pattern is removed only partly and parts of the intermediate layer will remain there as supporting parts.

A second important embodiment of a method according to the invention is characterized in that parts of the first pattern are provided with an auxiliary layer of substantially the same shape before the intermediate layer is provided and that after providing the second pattern of conductive material the intermediate layer is subjected to a first selective etching treatment in which the intermediate layer outside the area of the tracks of the second pattern is removed substantially over its whole thickness, after which the auxiliary layer on the lowermost pattern is removed by means of a selective etching treatment so that the said recesses are obtained, after which the intermediate layer is subjected to a second selective etching treatment in which the first pattern is exposed at the area of the crossings and the said supporting parts are formed from the intermediate layer in other places.

First a layer of material of which the first pattern consists may be provided and thereon a layer of material forming the auxiliary layer is provided, after which tracks in the form of the first pattern can be etched in both layers.

Different metals or semiconductor materials, for example, polycrystalline silicon, may be chosen for the various patterns and layers.

In certain cases an insulator may be chosen for the intermediate layer. Preferably a metal is used for this purpose which can be etched selectively with respect to the materials of the first and second patterns and which in addition is etched rapidly, such as, for example, aluminum.

The same applies to the auxiliary layer for which an insulating material or a metal, for eample, chromium, may be used.

The wiring system or electrode system which is obtained with any of the above-described methods may be provided on various supporting bodies, and the field of application thus is very wide. To be considered are, for eample, picture display devices as described in Applicants' Netherlands Patent Application No. 7510103.

The invention furthermore relates to a wiring system provided on a supporting body which is provided at a surface with a first pattern of electrically conductive material and with a second pattern of electrically conductive material having at least one track which crosses the first pattern and which at the area of the crossing of the first pattern is separated by a vacuum or gas, in which beyond the crossing supporting parts are present below the second pattern which extend throughout the distance between the body and the second pattern or between the first and the second pattern.

A wiring system according to a second aspect of the invention is characterized in that the tracks of the second pattern are formed by paths having a width which at the area of the crossing is substantially equal to the width at the area of the supporting parts. Very compact structures can be realized with such a wiring system in that the tracks can be chosen to be as narrow as the particular application allows.

The invention is of particular importance for integrated circuits in which, as is known, multilayer wiring systems are frequently used in so-called VLSI circuits.

BRIEF DESCRIPTION OF THE DRAWING

The invention will now be described in greater detail with reference to several embodiments and the accompanying drawings, in which.

It is to be noted that the figures are diagrammatic only and are not drawn to scale. Corresponding parts are generally referred to by the same reference numerals.

DETAILED DESCRIPTION OF THE PREFERRED EMBODIMENTS

Figure 1:
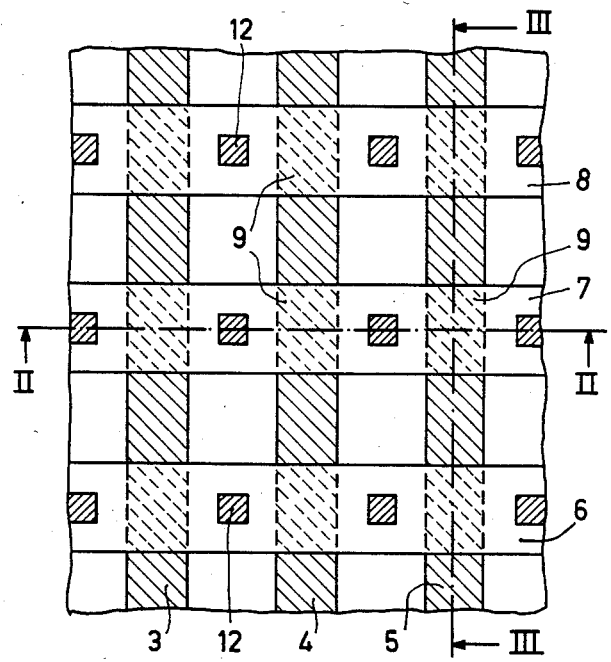
FIG. 1 is a plan view of a part of a semiconductor device having a wiring system manufactured by using a method according to the invention.
Figure 2:
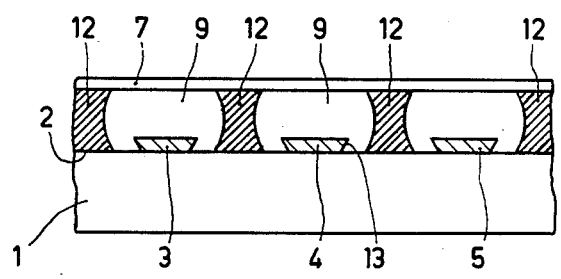
FIG. 2 is a cross-sectional view of this device taken on the line II—II of FIG. 1.
Figure 3:
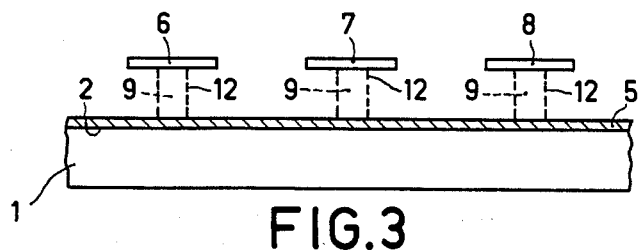
FIG. 3 is a sectional view of the same device taken on the line III—III of FIG. 1.

FIGS. 1 to 3 relate to a semiconductor device having a semiconductor body provided with a system of crossing wires. The device comprises a supporting body 1, in this example a semiconductor body, in which a number of circuit elements, for example, transistors, diodes, resistors and so on, may be provided. Said circuit elements, which further form no part of the invention, are not shown in the Figures and may be provided in the semiconductor body by means of generally known methods of manufacturing integrated circuits. As is usually the case, the semiconductor body 1 is of silicon, although other semiconductor materials may also be used. The circuit elements are situated near a surface 2 which, as is known, usually is passivated with an insulating layer of, for example, silicon oxide. For clarity the passivating layer is not shown in the Figures.

In order to connect the circuit elements together and to external supply conductors, the semiconductor body 1 has conductors at its surface 2. In the present example these are divided into a first conductive pattern which is situated directly on the semiconductor body 1 and to which the tracks 3-5 belong. As is known, these tracks may be connected to the various zones of the underlying circuit elements via contact windows in the passivating layer.

Above this lowermost first conductive pattern a second conductive pattern is present including the tracks 6-8 which in this example cross the tracks 3-5 of the first pattern at right angles.

The second pattern of conductive material is supported between the crossings 9 by supporting parts 12, in this example of aluminum. If desired, said supporting parts 12 may also be connected to underlying zones of the circuit elements via contact holes in the passivating layer. Although, of course, the supporting parts 12 are not visible in the plan view of FIG. 1, their position in FIG. 1 is denoted for clarity by the shaded areas 12. They do not occur in the plane of the cross-sectional view shown in FIG. 3; therefore their location is shown diagrammatically by means of broken lines.

The manufacture of the device shown in FIGS. 1 to 3 will be described in greater detail with reference to FIGS. 4 to 7 which are sectional views corresponding to the sectional view shown in FIG. 2 and taken on the line II—II of FIG. 1 during various stages of the manufacture of the device.

Figure 7:
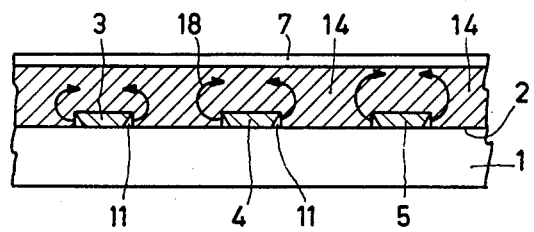

The starting material (FIG. 4) is a semiconductor body 1 in which the various zones of the circuit have been provided by means of known methods, for example, by masked diffusion or implantation of the suitable impurities, and which is provided at its surface 2 with a passivating layer or with passivating layers in which contact holes are formed. Via these contact holes the tracks 3-5 to be formed can be contacted with the various zones in the semiconductor body. After providing the tracks 3-5 an intermediate layer 14 of a material which can be etched selectively with respect to the first pattern and the second pattern (6, 7, 8) of conductive material to be provided afterwards, is provided over substantially the whole surface (FIG. 7). Using the second pattern as a mask, the intermediate layer 14 is removed over a substantial part of its thickness at the area of the crossings, while beyond the crossings 9 supporting parts 12 are formed from the intermediate layer.

According to the invention, the intermediate layer 14 at the area of the crossings 9 is in addition etched away on the lower side by providing between the first pattern of conductive material and the intermediate layer 14 recesses 11 for supplying the etchant, the etching treatment being continued at least until the first pattern is exposed entirely at the area of the crossing.

The recesses can be obtained in various manners. In the present example the tracks 3-5 have edges with a negative slope (see FIG. 2) so that a shadow effect occurs upon depositing the intermediate layer 14, as a result of which the said recesses 11 are formed (FIG. 7).

In order to form the tracks 3-5, the semiconductor body 1 is first covered over its whole surface with a layer 15 (FIG. 4), in this example of chromium. This layer has a thickness of approximately 0.05 micrometers and can be provided by means of sputtering or vapor deposition.

Figure 4:
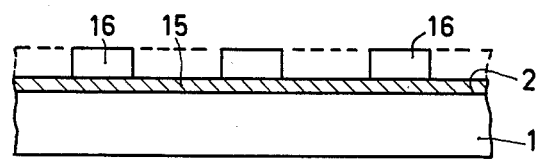
FIGS. 4 to 7 are sectional views of the device taken on the line II—II of FIG. 1 during several stages of the manufacture thereof.
Figure 5:
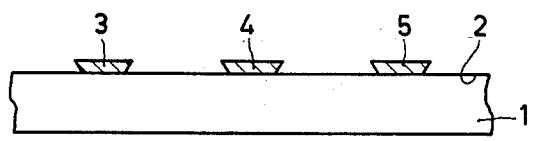
Figure 6:
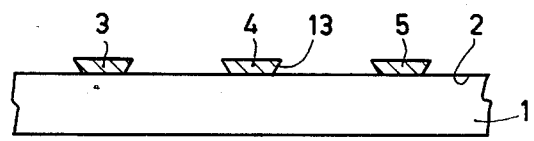

The device is then coated with a layer 16 of photosensitive material in which a pattern is provided in a generally known manner which corresponds to the pattern of the conductive tracks 3-5 to be provided (FIG. 4). Using this pattern of photoconductive material as a mask, the chromium layer 15 is then etched away on the parts of the surface 2 not protected by the mask. As an etchant is used, for example, a solution of 50 gram of cerium ammonium nitrate ($Ce(NH_4)_2(NO_3)6$) and 100 $cm^3$ of nitric acid ($HNO_3$) in one liter of water, while a generally known photolacquer, for example AZ2400 Shipley, is used for the photomask. It has been found experimentally that, as a result of a better adhesion of the chromium to the photolacquer than to the surface 2 which is covered with silicon oxide, this combination upon etching provides the desired negative slope of the edges of the tracks 3-5. So after termination of this etching treatment the tracks 3-5 are obtained, which have an upper area which is larger than the lower area (FIG. 5).

Herewith the first pattern of electrically conductive material has been provided. In order to manufacture a crossing connection, an intermediate layer 14 of a material which can be etched selectively with respect to the materials of the first and the second pattern, in this example, aluminum having a thickness of approximately 0.2-1 micrometer, is then provided over the whole surface.

The second pattern of conductive material is then provided on the intermediate layer 14. This is done, for example, by vapor-depositing a suitable conductive material and then etching it into a pattern, or by masked deposition.

However, the material of the second pattern is preferably provided by electroless deposition, in this example of nickel to a thickness of 0.05-0.8 micrometer, dependent on the use (FIG. 7). As will be explained in detail hereinafter, possible short-circuits between the first and the second pattern of conductive material are prevented by the electrodeposition.

Since the edges 13 of the tracks 3-5 have a negative slope, the recesses 11 in the intermediate layer have remained free from aluminum along the edges of the first pattern as a result of shadow effect upon depositing the intermediate layer 14. According to the invention, these recesses serve to transport the etchant everywhere along the lowermost pattern in a subsequent step of the manufacture in which the intermediate layer of aluminum is etched away, so that this etches the aluminum layer both from below and from above (using the tracks of the second pattern as an etching mask). As an etchant is used, for example, a 10% NaOH solution which etches away the aluminum rapidly but which substantially does not attack the chromium and the nickel.

As denoted by the arrows 18 in FIG. 7 the etchant etches away the intermediate layer 14 from the recesses 11 over a distance which is equal to half the width of the tracks 3-5. This means that on the one hand the mutual distance between two of these tracks in this method must be larger than the track width so as to maintain supporting parts 12, while on the other hand the tracks of the second pattern must be wider than those of the first pattern of conductive material.

After the etching treatment the device shown in FIG. 2 is obtained.

A pattern providing the desired shadow effect can also be obtained by manufacturing the first pattern of conductive material from a double layer, in which the lowermost layer can be dissolved more rapidly than the uppermost layer so that upon depositing the intermediate layer recesses remain.

Figure 8:
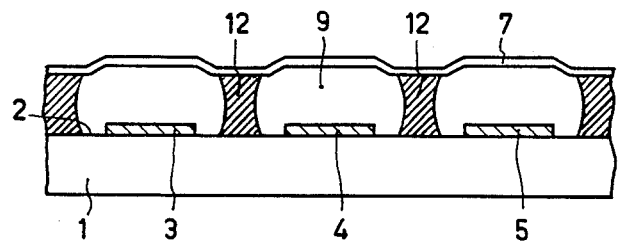
FIG. 8 is a sectional view taken on the line II—II of a wiring system with the same plan view as FIG. 1 manufactured by using a different method according to the invention.

Another method according to the invention in which the above-mentioned restriction with regard to the mutual distance between two tracks does not apply is shown in FIGS. 9 to 13 which show various stages of the manufacture of a device having the same plan view as in FIG. 1 and a cross-sectional view taken on the line II—II of FIG. 1 according to FIG. 8.

The device shown in FIG. 8 comprises a supporting body 1 which at its surface 2 has a wiring system having crossings 9 manufactured by using a method according to the invention. Beyond the places 9 where the tracks of the lowermost and uppermost patterns cross each other, the uppermost pattern is supported by supporting parts 12.

Figure 9:
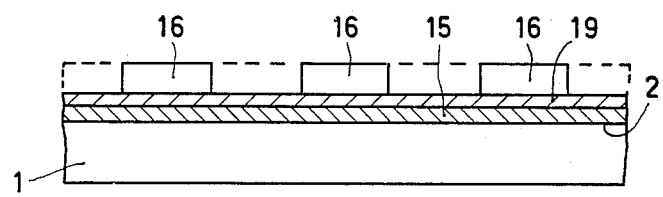
FIGS. 9 to 13 show the device of FIG. 8 during several stages of the manufacture thereof.

The manufacture of the device shown in FIG. 8 will be explained in greater detail with reference to FIGS. 9 to 13 which are sectional views corresponding to the sectional views shown in FIG. 9 taken on the line II—II of FIG. 8 during various stages of the manufacture of the device.

A first layer 15 of conductive material is provided on the supporting body 1, for example, by sputtering or vapor deposition. This first conductive layer 15 is then covered with an auxiliary layer 19 again by sputtering or vapor deposition. In this example the first conductive layer 15 consists of titanium, while the auxiliary layer 19 consists of chromium. Both layers have a thickness of 0.05–1 micrometer.

Figure 10:
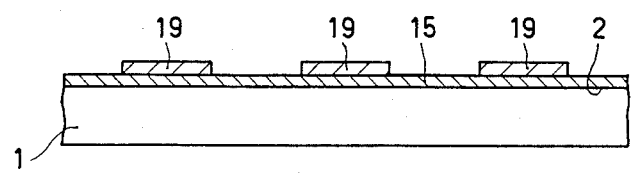

A layer 16 of photoconductive material is then provided over the whole surface and a mask is defined therein in a conventional manner which is to protect the chromium in a subsequent etching step (FIG. 10). This photomask has the same shape as the first pattern of conductive material to be formed and in this example comprises parallel tracks having a width of from 5 to 10 micrometers and a mutual distance of 10 to 20 micrometer.

The chromium is then etched away in the places not protected by the photomask using as an etchant a solution of 50 gram of cerium ammonium nitrate (Ce(NH$_4$)$_2$(NO$_3$)$_6$) and 100 cm$^3$ of nitric acid (HNO$_3$) in 1 liter of water. In this manner the auxiliary layer 19 of chromium obtains the same pattern as that of the first lowermost pattern of conductive material to be formed (FIG. 10). In a subsequent step the titanium on the non-protected parts is etched away with, for example, a 5% hydrofluoric acid solution.

The surface 2 is then coated with a double layer of titanium-chromium in the form of the first pattern, in this example the parallel tracks 3–5.

Figure 11:
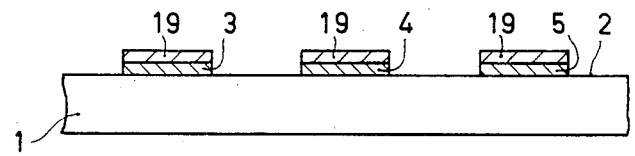
Figure 12:
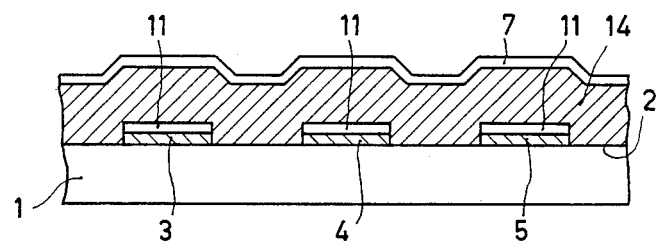

The intermediate layer 14 is then provided of a material, for example aluminum, which can be etched selectively with respect to the titanium and the nickel to be used for the second pattern. This intermediate layer 14 has a thickness of approximately 0.15 micrometer. A layer of nickel is electrodeposited on said intermediate layer, after which the second uppermost pattern is etched in the nickel layer by means of a 10% nitric acid solution, after a short dipping etch (10 seconds in 50% hydrochloric acid) so as to make the surface chemically active. As a result of this etching treatment the tracks 6–8 are obtained. The aluminum is then etched away between the tracks 6–8 as a result of which the lowermost pattern with the tracks 3–5 with the layer 19 is substantially exposed everywhere beyond the crossings (FIG. 11)

The chromium 19 is then etched away by means of the said solution of cerium ammonium nitrate and nitric acid.

Said etching is carried out in a very short period of time, namely in the order of a few minutes. As a result of this, recesses 11 for supplying etchant to etch the remaining aluminum (FIG. 12) are released in the device above the first pattern.

Figure 13:
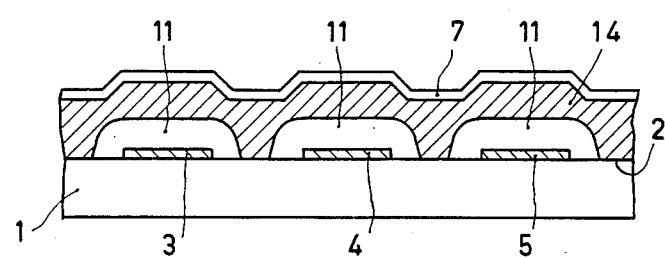
Figure 14:
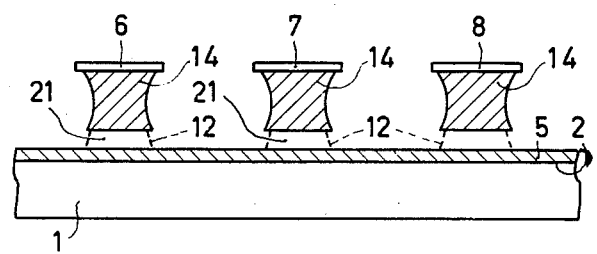
FIG. 14 is a cross-sectional view taken on the line III—III in FIG. 1 during the manufacture.

FIGS. 13 and 14 show an intermediate stage during the etching process as a cross-sectional view taken on the line II—II and the line III—III in the plan view of FIG. 1, respectively.

From the recesses 11 the etchant, in this example sodium hydroxide solution (NaOH), has free access to the lower side of the intermediate layer 14, so that said recesses 11 expand rapidly (FIG. 13). A recess 11 was present above the track 5. From said recess 11 the etchant attacks the lower side of the intermediate layer 14, so that openigns 21 are formed above said recesses 11 so that the etchant can penetrate even farther and more easily. (FIG. 14) Ultimately the etching process results in the (diagrammatic) sectional view of FIG. 8.

Figure 15:
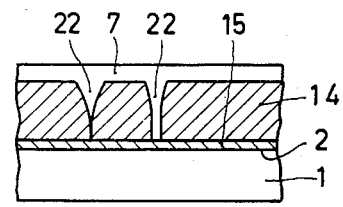
FIGS. 15A and B further shows the mechanism of the electroplating.
Figure 15:
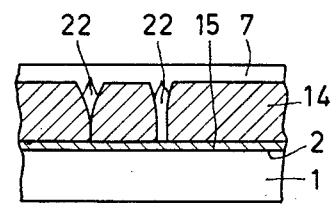

As already noted, the provision of the nickel layer is done by electrodeposition so as to avoid short-circuits. It has been found that the aluminum which is used as an intermediate layer 14 usually comprises so-called pin holes 22 which, when the nickel is deposited by sputtering, can be filled with nickel (FIG. 15a). In the above-described etching steps which remove the intermediate layer, said nickel is not attacked so that the possibility of shortcircuit at the area of the pin holes 22 is present.

As is known, in electrodeposition the growth takes place in one direction only due to the action of the electric field used so that pin holes 22, if any, are not filled but are closed on their upper sides by the growing layer of nickel. The possibility of shortcircuit is hence excluded (FIG. 15B).

Figure 16:
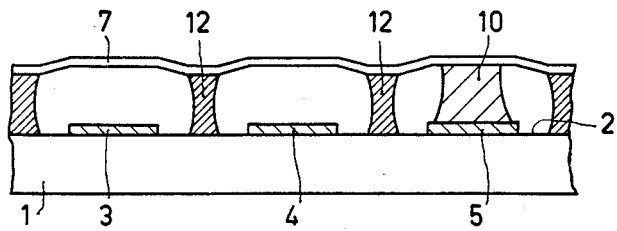
FIG. 16 denotes how an interconnection can be realized.

FIG. 16 shows how in this last process a conductive connection (via) can be formed between the first and the second pattern. At the area of the via to be provided the auxiliary layer 19 of chromium is removed. As a result of this, upon providing the aluminum intermediate layer 14 at the area of the crossing this is provided immediately on the lowermost pattern. Since the auxiliary layer is absent, no recess 11 is obtained in this area so that the etchant attacks the intermediate layer only laterally during the second etching treatment of the intermediate layer so that a supporting part 10 is obtained which also connects the first pattern conductively to the second pattern.

It will be obvious that the invention is not restricted to the examples described, but that many variations are possible to those skilled in the art without departing from the scope of this invention. It has already been noted, for example, that the material of the intermediate layer need not be removed entirely in all applications. Nor is the invention, of course, restricted to perpendicular crossings of parallel tracks, but any feasible configuration is possible for both the lowermost and the uppermost pattern of conductive material.

In a specific application, crossings obtained by means of the method described may be used as electrostatically controlled switches. Such an application may take place in a programmable read-only memory (PROM) in which the lower pattern of conductors is provided, for example, in a form in which, in co-operation with the upper pattern, a matrix of switches is obtained which are coupled to a matrix of circuit elements (for example, diodes) provided in the semiconductor body and which can be closed at will during programming.

Finally, of course, etchants other than those mentioned and other etching techniques (for example, also plasma etching) and other materials for the various patterns and layers are possible. If desired, the space between two crossing tracks may afterwards be filled again with a protecting insulating resin.

What is claimed is:

1. A method of manufacturing a wiring system on a supporting body having a major surface, which comprises:

providing a first pattern of electrically conductive material on said major surface;

providing an intermediate layer over substantially the entire major surface;

providing a second pattern of electrically conductive material having at least one track crossing the first pattern, said intermediate layer being provided by electrodeposition and being of a material which can be etched selectively with respect to both said first and second patterns;

providing a recess between said first pattern and said intermediate layer, said recess extending at least below said crossing;

then selectively etching said intermediate layer using the second pattern as an etching mask, said intermediate layer being etched away both laterally and also on its lower side at said crossing due to etchant flowing in said recess to remove substantially all of said intermediate layer at said crossing, while at other areas beneath said second pattern said intermediate layer is etched away only laterally to remove only part of said intermediate layer and form supporting parts for said second pattern from the remaining portions of said intermediate layer beneath said second pattern; and characterized in that parts of the first pattern are provided with an auxiliary layer of the same shape before the intermediate layer is provided, and that after providing the second pattern of conductive material the intermediate layer is subjected to a first selective etching treatment in which the intermediate layer outside the area the tracks of the second pattern is removed substantially over its whole thickness, after which the auxiliary layer on the first pattern is removed by means of a selective etching treatment so that said recesses are obtained, after which the intermediate layer is subjected to a second selective etching treatment in which the first pattern is exposed at the area of the crossings and said supporting parts are formed from the intermediate layer in other locations.

2. A method as claimed in claim 1, characterized in that before providing the intermediate layer in the form of a conductive layer, said auxiliary layer above the first pattern is removed locally so that upon providing the intermediate layer it is partly provided directly on the first pattern and upon etching the intermediate layer a conductive supporting part is obtained on said first pattern and forms a conductive connection between a track of the second pattern and the first pattern.

* * * * *